United States Patent [19]

Cunningham et al.

[11] Patent Number: 4,974,044
[45] Date of Patent: Nov. 27, 1990

[54] DEVICES HAVING ASYMMETRIC DELTA-DOPING

[75] Inventors: John E. Cunningham, Lincroft; Alastair M. Glass, Rumson; Erdmann F. Schubert, New Providence, all of N.J.

[73] Assignee: AT&T Bell Laboratories, Murray Hill, N.J.

[21] Appl. No.: 341,501

[22] Filed: Apr. 21, 1989

[51] Int. Cl.[5] .................... H01L 27/14; H01L 31/12; H01L 29/66; H01L 27/12
[52] U.S. Cl. .................................. 357/30; 357/19; 357/16; 357/4; 357/57
[58] Field of Search ............... 357/30, 19, 16, 57, 357/4

[56] References Cited

U.S. PATENT DOCUMENTS

| | | | |
|---|---|---|---|
| 3,626,328 | 12/1971 | Esaki | 357/16 X |
| 4,665,412 | 5/1987 | Ohkawa | 357/6 |
| 4,694,318 | 9/1987 | Capasso et al. | 357/30 |
| 4,772,335 | 9/1988 | Huang | 357/30 X |
| 4,794,611 | 12/1988 | Hara et al. | 357/45 |

OTHER PUBLICATIONS

*The Physics of Semiconductor Devices,* 2nd Edition, S. M. Sze, Chapter 1, John Wiley & Sons, New York, 1981.
*Advanced Crystal Growth,* P. M. Dryburgh, B. Cockayne, K. G. Barraclough, eds, Prentice Hall, London, 1987, Part IV.

*Primary Examiner*—Rolf Hille
*Assistant Examiner*—Roy Potter
*Attorney, Agent, or Firm*—Bruce S. Schneider

[57] ABSTRACT

The use of alternating n and p type regions asymmetrically spaced in a semiconductor material yields extremely advantageous properties. In particular, by controlling the doping level and the spatial configuration of the doped region both the device response and its optical properties are controllable. Therefore, in applications such as those involving optical switches LEDs, lasers and long wavelength detectors, both the speed of device and its optical properties are controllable. As a result, greater fabrication flexibility than previously available is possible.

18 Claims, 4 Drawing Sheets

DEVICES HAVING ASYMMETRIC DELTA-DOPING

BACKGROUND OF THE INVENTION

1. Field of the Invention

This invention relates to optical and electronic devices and, in particular, optical and electronic devices employing superlattice structures.

2. Art Background

Doping superlattice structures, i.e. structures, having a periodic doping profile including alternating n- and p-dopant regions, have been proposed for a variety of applications including optical switches, Light Emitting Diodes (LED), lasers, and photodetectors. In each application either (1) incident light is absorbed in the superlattice structure and the resulting photogenerated electrons and holes are separated yielding concomitant optical or electronic properties, or (2) an electric field is applied to the superlattice structure to induce the emission of light or to induce a change in optical properties.

Two generic configurations for superlattice devices have been proposed. In one configuration a periodic structure composed of crystalline materials of different compositions are layered to produce regions of different chemical potential separated by potential barriers. Although this configuration has great promise, often difficulties associated with the intimate contact between crystallographically diverse materials present problems. For example, large lattice mismatches between adjacent material regions lead to high defect density and even polycrystallinity which renders the structure unsuitable for device applications. The resulting limitations have restricted suitable materials for such devices to a few specific III-V and II-VI semiconductor materials.

A second superlattice structure that avoids difficulties associated with the contact of crystallographically different regions utilizes a symmetric δ-doping configuration. In this configuration, a single semiconductor material such as, for example, gallium arsenide is periodically doped with alternating concentrations of donors and acceptors. Generally, a fabrication procedure such as molecular beam epitaxy (MBE) is employed. A source or sources for the semiconductor material, e.g. a gallium and an arsenic source for gallium arsenide, together with sources for acceptor and donor dopants, e.g. beryllium and silicon resepectively, are used. Equally spaced alternating regions of acceptor doped gallium arsenide and donor doped gallium arsenide are deposited. In some structures these doped regions are adjoining while in other structures denominated δ-doped structures these regions are generally thin, e.g. a few atomic layers thick, and separated by regions of undoped gallium arsenide. In all cases, the structures are symmetric with respect to an inversion symmetry operation. Such a δ-doped structure yields an electronic band diagram such as shown in FIG. 1 corresponding to the structure shown where 2 denotes the valence band and 3 denotes the conduction band of the resulting device.

Structures with δ-doping have advantages over structures with crystallographically different compositions since difficulties associated with, for example, crystal lattice mismatch are avoided. However, in these devices, electronic and optic operating characteristics are interrelated such that improvement in one property often includes a degradation in a second. For example, the resesponse time of the device is determined by the distance indicated by 5 in FIG. 1. The electric field distribution in the device indicated by the angle 6 in FIG. 1 controls the optical absorption and transmission properties of the structure. Clearly, the distance 5 and the angle 6 are interdependent. As a result, if the optical properties are set, the electronic properties are predetermined while similarly if the electronic properties are chosen, then the optical properties are predetermined. Thus superlattice devices that are relatively easy to fabricate and that allow flexible control over the resulting device properties are not available.

SUMMARY OF THE INVENTION

The use of an asymmetric δ-doped configuration yeilds independent control over both optical and electronic device properties while allowing relative ease of fabrication. In particular, use of asymmetric δ-doping (i.e. a configuration in which the distance between a doped region and the adjacent region of opposite carrier type on either side are unequal for at least one such region) yields a band structure such as shown in FIG. 2. By varying the distance between adjacent donor and acceptor δ-doped regions separated by a region of low carrier density, i.e. less than $10^{17}$ dopants/cm$^3$ preferably less than $10^{15}$ dopants/cm$^3$ and by varying the period of these adjacent paired regions, both the electronic and optical properties of the device are controlled. That is, the spacings between adjacent δ-doped regions control the angles 10 and 11 related to electric field, while the δ-doping level controls the amplitude 9. Thus, the recombination rate controlled by the distance 14 as well as the optical properties controlled by electric field magnitudes 10 and 11 are all individually controlled and greater flexibility in device fabrication is available.

DETAILED DESCRIPTION

Figure 1:
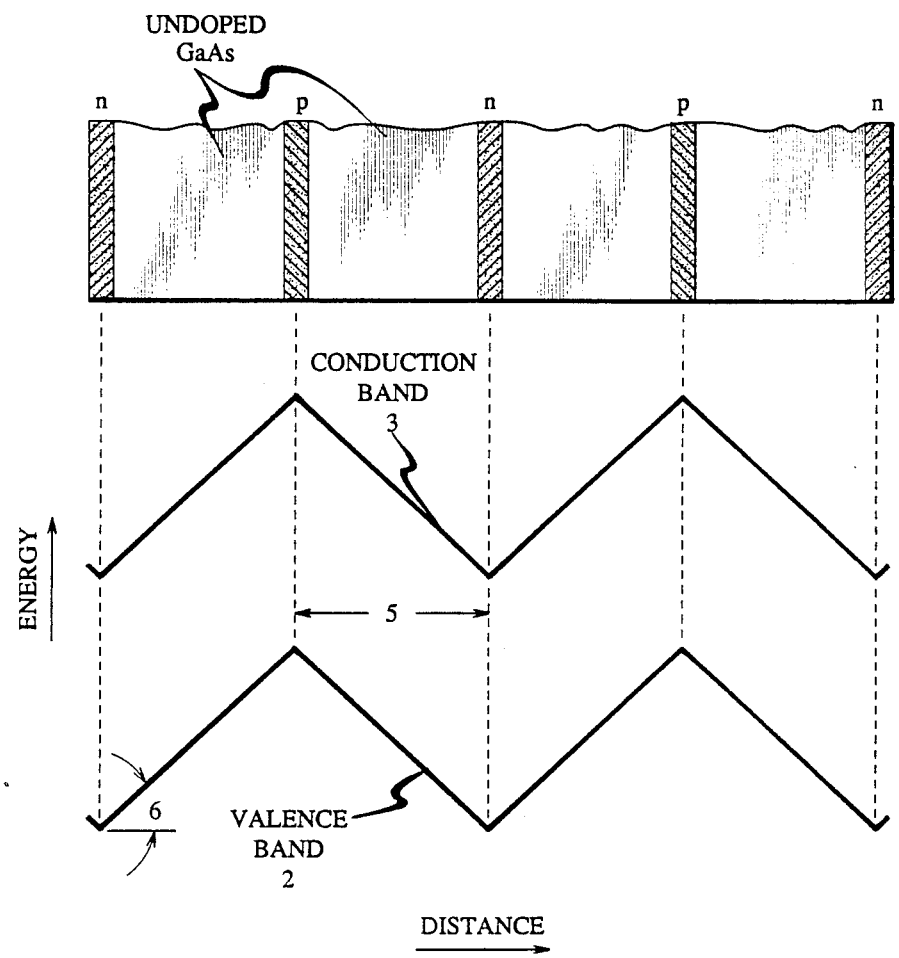
FIG. 1 is illustrative of symmetric δ-doped superlattice structures.
Figure 2:
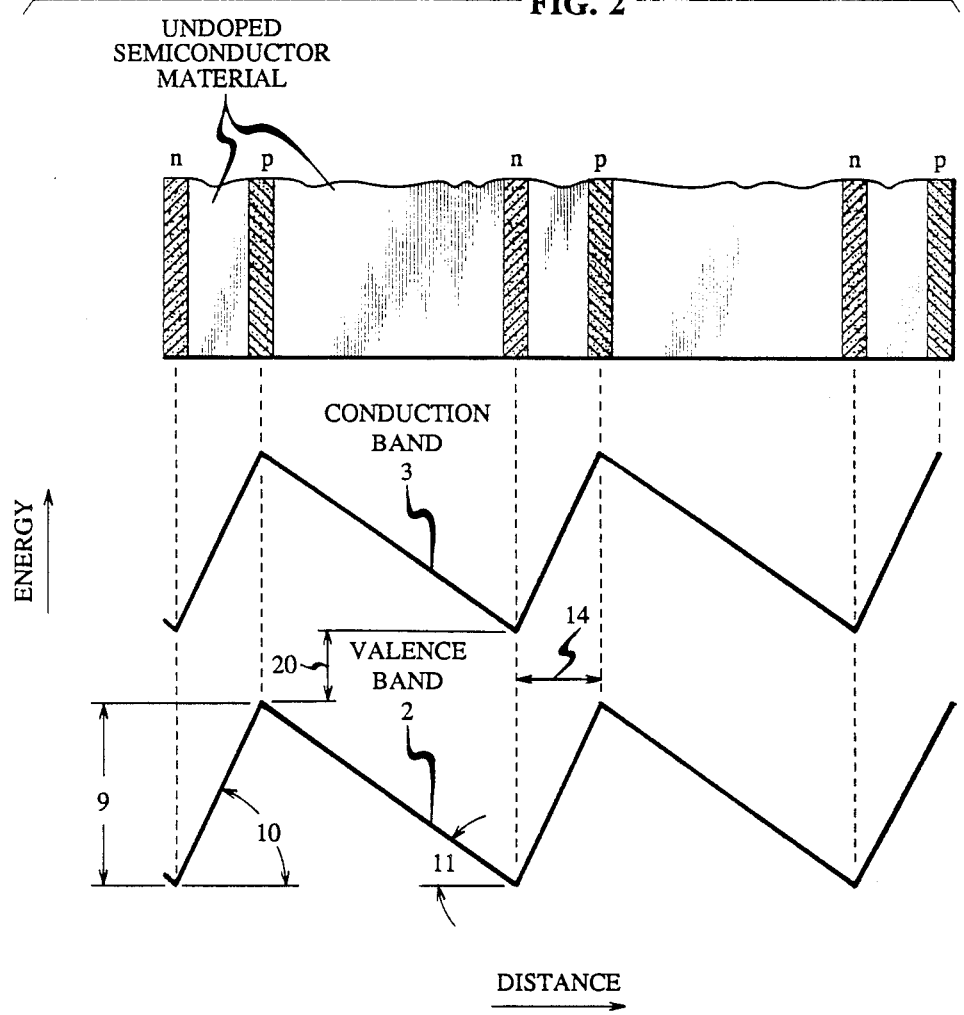
FIGS. 2-4 are illustrative of the inventive device structures.

As discussed, the inventive devices involve the use of δ-doping in an asymmetric configuration. Alternating relatively narrow regions of acceptor and of donor dopants are configurated in an asymmetric structure to yield the desired results. As discussed, for a given semiconductor material the spacings of these acceptor and donor regions as well as the dopant concentration within the δ regions control device properties. (While the invention will be described in terms of doped regions, the invention extends to any expedient for producing acceptor and donor states in these regions.)

In general, the δ-doped regions should contain donor or acceptor dopants such that 50% of the majority dopant states are confined in a region having a thickness less than ⅓ the distance between adjacent n- and p-regions (measured from the charge centroid of one region to the charge centroid of the next region) preferably less than 20 Å and indeed as thin as one monolayer. [The charge centroid is that point for which the sum over all loci in the δ-doped region of (1) the charge density times (2) the distance of this charge density from the centroid point is zero with distance on respective sides of the centroid being positive and negative.] Generally, within these regions majority dopant concentrations up to $5 \times 10^{13}$ cm$^{-2}$ are presently advantageous. Concentrations higher than $5 \times 10^{13}$ cm$^{-2}$, although not precluded, utilizing present-day fabrication techniques, tend to yield material with increased defect densities.

Typically, the dopant concentration within the p-doped region should be within 50% preferably within 10% of the concentration of the dopant in the adjacent n-doped regions. The greater the difference between the dopant concentrations in two adjacent doped regions, the greater the uncompensated charge, and thus the greater the shielding of the resulting electric fields. In essence, the electric fields are decreased by the uncompensated charge and thus the electronic and optical effects within the device are diminished. As a result, concentrations differing by more than 50% generally lead to devices with inadequate electronic or optical properties. Non-zero differences less than 50% are particularly suitable when a relatively conducting structure is desired.

Suitable dopants depend on the semiconductor material in which they are deposited. Generally, a suitable donor material for doping a semiconductor material has one more valence electron than the number of valence electrons in the atom of the semiconductor that occupies the crystallographic site into which the impurity substitutes. Similarly, a suitable acceptor impurity has one less valence electron than the substituted site constituent of the semiconductor material. Despite the method of choice, a donor dopant is one that produces a donor electronic state within 0.1 eV below the conduction band edge (as measured by the temperature dependence of the crystal conductivity in a homogeneously crystal having the same composition and dopant as the $\delta$-doped region, see *The Physics of Semiconductor Devices* 2nd edition, S. M. Sze, Chapter 1, John Wiley & Sons, New York, 1981) while an acceptor dopant is one that produces an electronic state within 0.1 eV above the valence band edge. (Deep level dopants such as iron an indium phosphide that produce electronic states removed from the conduction and valence band more than 0.1 eV, although not precluded, are not considered when determining if a suitable dopant concentration is present in a $\delta$-doped region.)

Exemplary of suitable dopants are silicon and beryllium which are respectively donor and acceptor dopants in gallium arsenide, and tin and zinc which are respectively donor and acceptor dopants in indium phoshide. Use of deep level dopants such as iron for indium phosphide and chromium for gallium arsenide, as discussed, is not precluded and in some circumstances is useful. The use of such deep level dopants reduces the density of uncompensated charge due to the $\delta$ doping and thus reduces undesirable screen effects and/or electrical conductivity.

The particular semicondutor material employed is not critical. Materials such as III-V semiconductor material (e.g. indium phosphide, gallium arsenide, gallium aluminum arsenide, and the ternary and quaternary alloys of these III-V materials), II-VI semiconductor materials such as zinc selenide, cadmium telluride and mercury cadmium telluride, as well as group IV semiconductor materials such as silicon, germanium, alloys of silicon and germanium, amorphous silicon and diamond are acceptable. (Semiconductor materials in this context are those having a conductivity that increases with temperature and having a carrier mobility greater than 1 cm$^2$ per volt second.)

The spacing between adjacent n-doped and p-doped regions is extremely important. Regions of n- and p-type majority carriers should alternate and should be separated by a low carrier density semiconductor material with a thickness not less than 20 Å and typically not more than 0.2 $\mu$m. (This distance is measured from the point of mean concentration of dopant within the region containing dopant material, i.e. the centroid, to the center of the mean concentration of the adjacent doped region.) The distance between a $\delta$-doped region and the next $\delta$-doped region having the same dopant type should be no less than 50 Å and no more than 0.5 $\mu$m. Distances greater than 0.5 $\mu$m lead to insignificant effects while distances less than 20 Å lead to excessive variations in the electric field between dopant regions. Additionally, the doped regions should be asymmetrically placed. The distance beween any given adjacent n- and p-region pair should be at least 15% larger or 15% smaller than the distance between each of these regions and their adjacent doped regions that are not a member of the pair.

A variety of methods are available for fabricating the inventive devices. For example (1) gas source or solid source molecular beam epitaxy (MBE) or (2) metal organic chemical vapor deposition (MOCVD) are suitable for producing $\delta$-doped asymmetrically placed regions. A full description of these deposition procedures is found in *Advanced Crystal Growth*, P. M. Dryburgh, B. Cockayne, K. G. Barraclough eds., Prentice Hall, London, 1987, part IV. Although other fabrication techniques such as sputtering are less convenient and more difficult to control, they are not precluded.

Generally, the asymmetric $\delta$-doped structure is produced on a substrate. The substrate is typically a material of the same composition as the semiconductor material of the superlattice. Alternatively, a substrate of different composition is also suitable for amorphous semiconductor material or for crystalline material that is lattice matched, i.e. lattices corresponding to within 5%. In addition to the substrate and superlattice structure a variety of other layers, although not essential are acceptable and often desirable. For example, a capping and/or passivating layer, a buffer layer, additional doped semiconductor regions, and/or electrical contact layers are suitable. Typical passivating and capping layers are formed from silicon dioxide or a semiconductor material and typical buffer layers are produced from the same semiconductor material as the superlattice.

Figure 3:
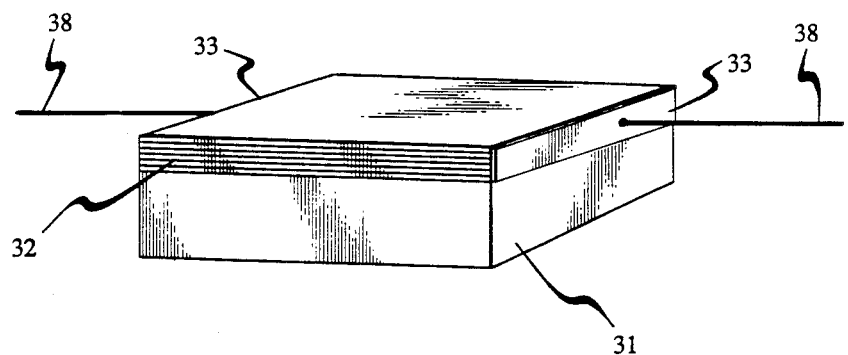
Figure 4:
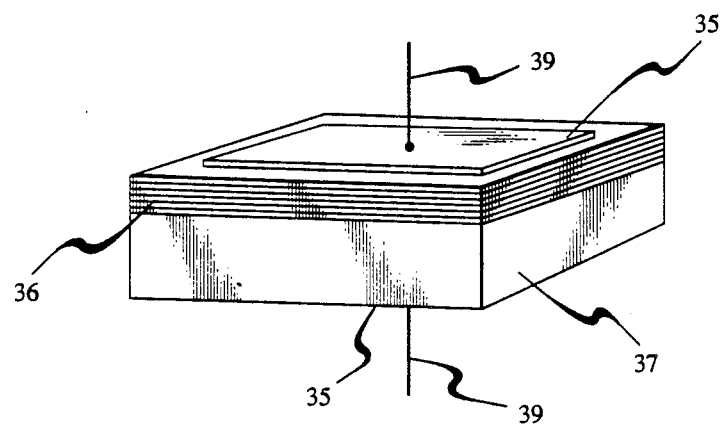

Electrodes are employed either to inject charge, or to collect charge produced, for example, from optical processes. The configuration of the electrode depends on the particular device that is produced. For example, for electron injection such as employed in a laser structure or field application as employed in electrooptic devices, configurations such as edge electrodes and face electrodes are employed. For withdrawing electrons, as would be utilized in a detector, configurations such as the edge configuration shown in FIG. 3 where 31 is an insulating substrate, 32, is the superlattice and 33 are the electrodes employed. In the face electrode structure shown in FIG. 4 the major surface of the electrode 35 are positioned on the faces parallel to the superlattice faces 36 in conjunction with a conducting substrate, 37 and electrical leads, 38. The electrode, however, need not cover the entire face or edge and it is possible for it to include a plurality of regions. Typical electrode materials include layers of metals such as gold or aluminum. Thin layers, i.e. layers thinner than 200 Å, are advantageously employed when light must pass through the electrode. For example, in configurations such as shown in FIG. 4, it is possible to pass light through electrode, 35, into superlattice region, 36, provided the electrode has sufficient transparency, thus producing charges that are separated and detected at the electrodes through leads 39. In another embodiment the charge induced in the superlattice region by incident light is measured by a second light beam incident on the superlattice to detect optical changes through corresponding changes in absorption or transmission. Alternatively in the configuration shown in either FIG. 4 or 5 charge is injected by applying a voltage to the electrodes that in turn induces combination of separted charges and emission of light. Indeed such structures are useful for optical processes, i.e. absorption resulting in electronic changes that are then detected, or electronic processes such as injection of charge that is subsequently detected as an optical effect, i.e. emission of light, change in refractive index, change in optical absorption or change in reflection. In an embodiment where incident light induces a change in optical properties, that in turn is detected by a second incident light, electrodes are not essential.

A variety of devices are producible utilizing the inventive asymmetric configuration. For example, to produce one type of optical switch the δ-doped regions are configured to produce reflection of incoming light. Such reflection is achieved by positioning the δ-doped regions of the same dopant type so that they are separated by a distance approximately equal to one half the wavelength of incident light divided by the refractive index of the semiconductor material at the wavelength of the incident light. Incoming light is reflected where there is no screening of the superlattice by charge carriers either injected from the electrodes or optically generated. However, upon screening produced by optical excitation or injection from electrodes, the electric fields within the superlattice are reduced resulting in reducing the refractive index changes allowing greater transmission of light. As previously discussed, irrespective of the particular device formed, the response time of the device depends on the distance, 14, together with the minimum bandgap, 20, and the optical properties of the device depends primarily but not solely on the low electric field region, i.e. the smaller angle, 11. Greater dopant concentrations increase the electric field.

The number of n-type dopant regions and the number of p-type dopant regions depend on the device application. Typically, between 10 and 1000 n-type/p-type region pairs are employed. Less than 10 pairs although not precluded generally lead to decreased electrical or optical properties while more than 1000 pairs typically are uneconomic to produce. However, the invention extends to as little as three doped regions, two of which are of one dopant type and the third of the other dopant type. If an odd number of regions are employed, the totality of the dopant density of each type should fall within the previously discussed boundaries to avoid excess screening. Generally, sufficient number of periods are employed so that the aborption of the superlattice regions at the operating wavelength is greater than 10% of the light reaching this region. Nevertheless, for devices such as electrooptic modulators, lasers and LEDs where absorption is not desirable, absorption less than 10% is generally advantageous.

Typically absorption varies linearly with the number of periods. The wavelength at which absorption occurs is determined by both the bandgap of the semiconductor material and by the magnitude of the electric fields in the superlattice. Thus by adjusting these parameters the wavelength is similarly adjusted. In this manner the optical properties of the device are configured to the particular application. For example, in the use of photodetectors, the absorbing wavelength is modified to have a relatively high absorption to the wavelength at which detection is desired. It should be noted that the dopant concentration and spacings need not remain constant throughout the superlattice. By using variations in parameters, a corresponding variation in optical characteristic is obtainable.

The following examples are illustrative of device configurations involved in the invention.

EXAMPLE 1

A superlattice consisting of δ-doped GaAs was grown by gas source MBE. The source materials for GaAs growth were elemental gallium held at 970° C. and gaseous $AsH_3$. The $AsH_3$ was heated to 850° C. to yield elemental As and Hydrogen.

An n-type GaAs substrate, doped with approximately $10^{18}$ silicon atoms/cm$^3$, of 0.020" thickness was placed approximately 8" from the sources and heated to 550° C. GaAs was grown epitaxially on the substrate at a rate of approximately 1 μm per hour by allowing the As and Ga beams to simultaneously impinge on the substrate. Elemental dopant sources of Be and Si were heated to 1060° C. and 680° C. respectively. The flow of all elements to the substrate was controlled with shutters which were opened and closed to yield the desired doping.

An n-type buffer layer of GaAs of 5000 Å thickness and $10^{18}$ Si atoms/cm$^3$ was first grown on the substrate. Next, a δ-doped superlattice was grown including alternating layers of Si and Be having a density of $10^{13}$ atoms/cm$^2$ in each layer. The thickness of the δ-doped regions was approximately one monolayer as determined by separate calibration studies using capacitance-voltage profiling and transmission electron microscopy. The density of dopants was controlled by opening each shutter for a brief duration and was determined by separate calibration experiments using capacitance-voltage profiling.

The distance between the first Be δ-doped layer and the first Si δ-doped layer was 75 Å. The distance between the first Si layer and the second Be layer was 500 Å. The regions between the δ-doped layers were undoped GaAs. This sequence of δ-doping was repeated until 15 pairs of Be and Si δ-doped regions had been deposited. A final n-type capping layer of 100 Å thick GaAs uniformly doped with $10^{18}$ Si impurities per cm$^3$ was deposited over the superlattice.

Figure 5:
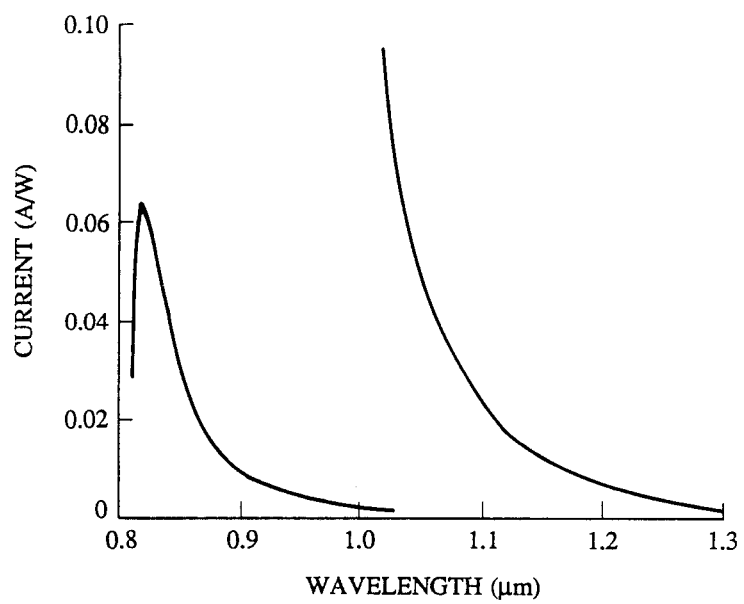
FIGS. 5 and 6 are illustrative of properties involved in the invention devices.

Semi-transparent electrodes, 100 Å thick, of Au-Ge alloy were evaporated on top of the capping layer and onto the back face of the substrate. The entire substrate was electroded, but only an area 1 mm$^2$ was evaporated onto the capping layer. Gold leads were electrically contacted to the Au-Ge electrodes using conducting epoxy. The leads were connected to a lock-in amplifier (Princeton Applied Research model HR8) to measure the electric current developed in the superlattice upon illumination. The superlattice was illuminated with light of variable wavelength from a monochromator (¼ m Jarrell Ash). The light intensity was about 1 mW/cm$^2$. The light was chopped at a frequency of 100 Hz using a mechanical chopper. The current response at 100 Hz of the superlattice for different wavelengths is shown in FIG. 5. Current values as high as 0.01 Amps per watt of incident light was measured at 0.9 μm wavelength. At a wavelength of 1.06 μm the current measured was 0.001 A/watt. Lower current values were measured at wavelengths to 1.3 μm.

While the data in FIG. 5 was taken at 10 degrees Kelvin (the sample was cooled in a cryostat with optical windows) similar data was obtained at room temperature. GaAs without a superlattice only responds to wavelengths shorter than about 0.85 μm. The observed response at longer wavelengths than this was due to the high electric fields in the superlattice resulting in increased absorption at longer wavelengths.

When the light was extinguished the current decreased with a time constant of 1 to 2 microseconds. This time period was the recombination time for electrons and holes from the n- to p-δ-doped regions (short distance).

The same response time was observed when using short pulses of light of 50 ns duration from a YAG:Nd laser operating at 1.06 μm.

EXAMPLE 2

Figure 6:
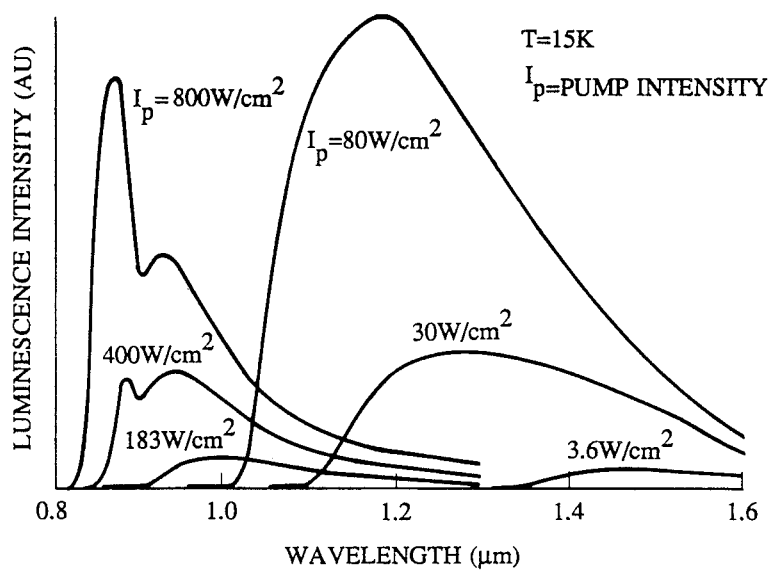

The superlattice of Example 1 was illuminated with continuous wave light from an argon ion laser at a wavelength of 5145 Å. The luminescence emitted by the superlattice due to this exciting light was monitored with a monochromator. The detector used was germanium detector. At low excitation intensity (3 W/cm$^2$ with 5145 Å radiation) light was emitted from the superlattice at wavelengths from 1.3 μm to 1.8 μm (the cut-off wavelength of the Ge detector). (See FIG. 6.) This emission is due to recombination of electrons and holes across the short distance from n- to p-doped regions. At higher illumination intensities ($\sim$400 W/cm$^2$ of 5145 Å radiation) light was emitted at shorter wavelengths, primarily from 0.83 μm to 1.12 μm as shown in FIG. 5. As the illumination intensity increased, the luminescence spectrum shifted to shorter wavelengths. This was due to the screening of the electric fields in the superlattice at high excitation densities.

Using short pulse excitation (50 ns duration) from a YAG:ND laser (doubled to 0.53 μm using a potassium titanyl phosphate doubling crystal) the luminescence at 1.5 μm decreased with a time constant of about 1-2 microseconds.

EXAMPLE 3

The superlattice sample of Example 1 was examined with a monochromator as in Example 2. An alternating current potential of 5 volts was applied to the electrodes with a frequency of 1 kHz. The luminescence variation due to this applied voltage was monitored as in Example 1. When the voltage was applied the luminescence from the sample moved to shorter wavelengths due to charge injection and modification of the electric fields.

EXAMPLE 4

A second sample was prepared by MBE as described in Example 1, but with a density of p- and n-dopants of $2 \times 10^{13}$ cm$^{-2}$. The electric fields in the superlattice increased twofold because of the increased doping density. The luminescence at 1.8 μm was more intense than that shown in FIG. 5. Using short pulse excitation, as before, at 0.53 μm the decay time of the luminescence was observed to be shorter than 50 ns, the incident pulse duration. This demonstrates that the carrier recombination time can be controlled by appropriate control of the doping density.

We claim:

1. A device comprising a semiconductor material portion including three regions said regions comprising a first type having acceptor states and a second type having donor states with two of said regions being one type and one of said regions being the other type wherein (1) said first type regions and said second type regions are alternately spaced along a direction within said portion (2) said alternately spaced regions are separated by regions of said semiconductor material with a low carrier density and (3) said regions are asymmetrically spaced wherein the spacings between one of said regions and the adjoining two regions differ by more than 15 percent.

2. The device of claim 1 wherein said donor and acceptor states are produced by dopants.

3. The device of claim 1 wherein said semiconductor material comprises a III-V semiconductor material.

4. The device of claim 3 wherein said material comprises a composition chosen from the group consisting of indium phosphide and gallium aresenide.

5. The device of claim 1 wherein said semiconductor material comprises a II-VI semiconductor material.

6. The device of claim 1 wherein said semiconductor material comprises a group IV material.

7. The device of claim 6 wherein said semiconductor material comprises a composition chosen from the group consisting of silicon, germanium, and diamond.

8. The device of claim 1 wherein said semiconductor material portion includes a deep level dopant.

9. The device of claim 1 wherein said regions are spaced such that in the absence of an applied external field incident light is reflected.

10. The device of claim 1 including electrodes.

11. The device of claim 10 wherein said electrodes are adapted for injecting charge.

12. The device of claim 10 wherein at least one of said electrodes is transparent to incident light.

13. The device of claim 10 wherein said electrodes are configured on the faces of said device.

14. The device of claim 10 wherein said electrodes are configured on the edges of said device.

15. The device of claim 1 wherein said regions are less than 20 Å thick.

16. The device of claim 15 wherein said regions are separated by at least 20 Å.

17. The device of claim 1 wherein said regions are separated by at least 20 Å.

18. The device of claim 1 wherein said regions are disposed on a substrate.

* * * * *